United States Patent
Ballard et al.

(10) Patent No.: US 11,486,910 B1
(45) Date of Patent: Nov. 1, 2022

(54) FLUX SWITCH SYSTEM

(71) Applicants: Cody James Ballard, Catonsville, MD (US); Andrew Hostetler Miklich, Columbia, MD (US); Micah John Atman Stoutimore, Kensington, MD (US); Robert Miller, Hanover, MD (US); Joel D. Strand, Ellicott City, MD (US); Kurt Pleim, Halethorpe, MD (US)

(72) Inventors: Cody James Ballard, Catonsville, MD (US); Andrew Hostetler Miklich, Columbia, MD (US); Micah John Atman Stoutimore, Kensington, MD (US); Robert Miller, Hanover, MD (US); Joel D. Strand, Ellicott City, MD (US); Kurt Pleim, Halethorpe, MD (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

(21) Appl. No.: 17/315,492

(22) Filed: May 10, 2021

(51) Int. Cl.
*G01R 19/14* (2006.01)
*G01R 15/18* (2006.01)

(52) U.S. Cl.
CPC .............. *G01R 19/14* (2013.01); *G01R 15/18* (2013.01)

(58) Field of Classification Search
CPC .................................. G01R 19/14; G01R 15/18
USPC .......................................................... 324/126
See application file for complete search history.

(56) References Cited

U.S. PATENT DOCUMENTS

| 4,051,393 | A | 9/1977 | Fulton |
| 7,116,094 | B2* | 10/2006 | Levin .................. G01R 31/2886 324/126 |
| 9,646,682 | B1* | 5/2017 | Miller .................. G11C 11/1673 |
| 10,574,251 | B1* | 2/2020 | Stoutimore .......... H03K 19/195 |
| 2019/0149139 | A1* | 5/2019 | Braun ...................... H03K 3/38 327/225 |
| 2019/0339339 | A1* | 11/2019 | Berggren ............... G01R 33/02 |

FOREIGN PATENT DOCUMENTS

WO 2018/203943 A2 11/2018

OTHER PUBLICATIONS

Extended European Search Report (EESR) dated Sep. 20, 2022 for corresponding EP 22163964.4-1205.

(Continued)

*Primary Examiner* — Christopher P McAndrew
(74) *Attorney, Agent, or Firm* — Tarolli, Sundheim, Covell & Tummino LLP (57) ABSTRACT

One example includes a flux switch system. The system includes an input stage configured to provide an interrogation pulse. The system also includes a plurality of flux loops configured to receive an input current. Each of the flux loops includes a Josephson junction configured to trigger to generate an output pulse in response to a first polarity of the input current and to not trigger to generate no output pulse in response to a second polarity of the input current opposite the first polarity. The system further includes an output stage configured to propagate the output pulse to an output of the flux switch system.

20 Claims, 4 Drawing Sheets

(56) References Cited

OTHER PUBLICATIONS

Mizugaki, et al.: "Josephson Switching Device Utilizing the Quantum Transitions in a Superconducting Quantum Interference Device Loop"; Japanese Journal of Applied Physics, Japane Society of Applied Physics, JP, vol. 39, No. 1, Part 01, Jan. 1, 2000 (Jan. 1, 2000), pp. 55-60, XP001017766, ISSN: 0021-4922, DOI: 10.1143/JJAP.3955, * Section 2; figure 1*.

* cited by examiner

252 PROVIDE A BIAS CURRENT TO EACH OF A PLURALITY OF FLUX LOOPS TO PROVIDE A CURRENT IN EACH OF THE FLUX LOOPS, EACH OF THE FLUX LOOPS COMPRISING A JOSEPHSON JUNCTION

254 INDUCTIVELY PROVIDE THE INPUT CURRENT TO EACH OF THE FLUX LOOPS

256 PROVIDE AN INTERROGATION PULSE TO THE FLUX LOOPS VIA AN INPUT STAGE

258 DETERMINE THAT THE INPUT CURRENT HAS A FIRST POLARITY IN RESPONSE TO AN OUTPUT PULSE BEING PROVIDED FROM AN OUTPUT STAGE RESULTING FROM A TRIGGERING OF THE JOSEPHSON JUNCTION OF EACH OF THE FLUX LOOPS IN RESPONSE TO THE INTERROGATION PULSE AND BASED ON THE CURRENT IN EACH OF THE FLUX LOOPS

260 DETERMINE THAT THE INPUT CURRENT HAS A SECOND POLARITY OPPOSITE THE FIRST POLARITY IN RESPONSE TO NO OUTPUT PULSE BEING PROVIDED FROM THE OUTPUT STAGE

FIG. 6

FLUX SWITCH SYSTEM

TECHNICAL FIELD

This disclosure relates generally to classical and superconducting computing systems, and more specifically to a flux switch system.

BACKGROUND

In a variety of different types of superconducting circuits, control currents are typically implemented to control data states. For example, currents can be inductively provided to superconducting circuits via inductive couplings to induce a flux in control loops to control data. A variety of different types of superconducting circuits implement such a control current, such as a superconducting quantum interference device (SQUID), a quantum flux parametron (QFP), or a variety of other devices. The control current that is provided to a superconducting circuit or a portion of a superconducting circuit may be unknown as to the current direction. Therefore, additional circuits can be implemented to query the sign of a control current to indicate the direction of current flow of the control current.

SUMMARY

One example includes a flux switch system. The system includes an input stage configured to provide an interrogation pulse. The system also includes a plurality of flux loops configured to receive an input current. Each of the flux loops includes a Josephson junction configured to trigger to generate an output pulse in response to a first polarity of the input current and to not trigger to generate no output pulse in response to a second polarity of the input current opposite the first polarity. The system further includes an output stage configured to propagate the output pulse to an output of the flux switch system.

Another example includes a method for determining a polarity of an input current. The method includes providing a bias current to each of a plurality of flux loops to provide a current in each of the flux loops. Each of the flux loops includes a Josephson junction. The method also includes inductively providing the input current to each of the flux loops and providing an interrogation pulse to the flux loops via an input stage. The method also includes determining that the input current has a first polarity in response to an output pulse being provided from an output stage resulting from a triggering of the Josephson junction of each of the flux loops in response to the interrogation pulse and based on the currents in each of the flux loops. The method further includes determining that the input current has a second polarity opposite the first polarity in response to no output pulse being provided from the output stage.

Another example includes a flux switch system. The system includes an input stage configured to provide a reciprocal quantum logic (RQL) interrogation pulse. The system also includes a first flux loop comprising a first inductor that is inductively coupled to an input current and a first Josephson junction. Each of the first inductor and the first Josephson junction are coupled to the input stage and the first flux loop is configured to conduct a first current in response to a bias current. The system also includes a second flux loop comprising a second inductor that is inductively coupled to the input current and a second Josephson junction. The second flux loop is configured to conduct a second current in response to the bias current. The first and second Josephson junctions can be configured to trigger to generate an RQL output pulse in response to a first polarity of the input current and the RQL interrogation pulse based on a relative of the first and second currents, and can be configured to not trigger in response to a second polarity of the input current and the RQL interrogation pulse. The system further includes an output stage coupled to the second inductor and the second Josephson junction. The output stage can be configured to propagate the RQL output pulse to an output of the flux switch system.

DETAILED DESCRIPTION

This disclosure relates generally to classical and superconducting computing systems, and more specifically to a flux switch system. The flux switch system can be configured as an analog-to-digital converter (ADC) to provide an indication of a sign of a current, such as in a superconducting circuit system. For example, the ADC can be a single-bit ADC that is configured to provide an output pulse (e.g., reciprocal quantum logic (RQL) pulse) in response to the current having a first current direction and to not provide an output pulse in response to the current having a second current direction. For example, the flux switch system can be provided an interrogation pulse (e.g., an RQL pulse) to interrogate the current direction of the current.

The flux switch system includes an input stage, an output stage, and a plurality of flux loops. The input stage is configured to receive an interrogation pulse (e.g., an RQL pulse) that can be provided to interrogate the sign of the input current to be monitored. The input current can be provided to the plurality of flux loops, such that the input current is inductively coupled to the flux loops to induce a current in the flux loops. As an example, the flux loops can include a first flux loop and a second flux loop that each receive a bias current that provides first and second currents that circulate in opposite orientations in the flux loops. Therefore, the first and second currents provide a steady-state equal and opposite amplitude with respect to a flux in the respective flux loops. As an example, the flux loops can each include a Josephson junction and an inductor that receives the induced current from the input current.

In response to the input current having a first direction, the input current can induce currents in a first direction to increase the amplitude of the first current and decrease the amplitude of the second current. The increase in amplitude of the first current can increase the bias of the Josephson junction associated with the first flux loop, such that the Josephson junction can trigger in response to the interrogation pulse. The triggering of the Josephson junction of the first flux loop can thus result in triggering of the Josephson junction of the second flux loop, and thus to provide an output pulse (e.g., an RQL pulse) from the output stage that is coupled to the second flux loop to indicate that the input current has the first current direction. However, in response to the input current having a second direction opposite the first direction, the input current can induce currents in a second direction opposite the first direction to decrease the amplitude of the first current and to increase the amplitude of the second current. The decrease in amplitude of the first current can decrease the bias of the Josephson junction associated with the first flux loop. As a result, the Josephson junction of the first flux loop does not trigger in response to the interrogation pulse. Therefore, no pulse is provided from the output stage to indicate that the input current has the second current direction.

Figure 1:
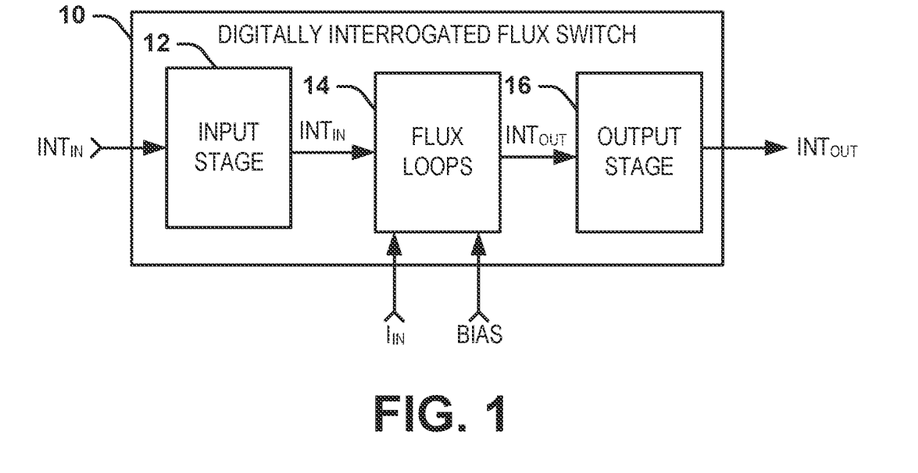
FIG. 1 illustrates an example of a flux switch system.

FIG. 1 illustrates an example of a flux switch system 10. The flux switch system 10 can be implemented in any of a variety of superconducting computer systems to determine a sign (e.g., direction) of an input current $I_{IN}$ in response to an interrogation pulse $INT_{IN}$ (e.g., a reciprocal quantum logic (RQL) pulse). For example, the flux switch system 10 can be configured as an analog-to-digital converter (ADC) to provide an indication of a sign of the input current $I_{IN}$. For example, the flux switch system 10 can be a single-bit ADC that is configured to provide an output pulse $INT_{OUT}$ (e.g., an RQL pulse) in response to the input current $I_{IN}$ having a first current direction and to not provide the output pulse $INT_{OUT}$ in response to the input current $I_{IN}$ having a second current direction.

The flux switch system 10 includes an input stage 12, a plurality of flux loops 14, and an output stage 16. The input stage 12 can be configured as a Josephson transmission line (JTL) that can be configured to propagate the interrogation pulse $INT_{IN}$. For example, the interrogation pulse $INT_{IN}$ can be an RQL pulse, such that the input stage 12 can be biased via an RQL clock signal to receive the interrogation pulse $INT_{IN}$ and to propagate the interrogation pulse $INT_{IN}$ to the flux loops 14. As an example, the interrogation pulse $INT_{IN}$ can be provided to the flux switch system 10 to interrogate the state of the input current $I_{IN}$, such that the interrogation pulse $INT_{IN}$ can be provided at a time in which the input current $I_{IN}$ has a non-zero amplitude.

The flux loops 14 are demonstrated in the example of FIG. 1 as receiving both the input current $I_{IN}$ and a bias signal BIAS. For example, the flux loops 14 can include a first flux loop and a second flux loop that each include an inductor and a Josephson junction. As an example, the input current $I_{IN}$ can be inductively coupled to each of the flux loops 14, such as via the inductor associated with each of the first and second flux loops 14. The bias signal BIAS can be provided to each of the flux loops 14 to provide first and second currents that circulate in opposite orientations in the respective flux loops 14. Therefore, the first and second currents provide a steady-state equal and opposite amplitude with respect to a flux in the respective flux loops 14. As described herein, the first and second currents can have amplitudes that are modified by the inductive coupling of the input current $I_{IN}$ to adjust a bias of the respective Josephson junctions of the flux loops 14.

The output stage 16 is coupled to a last of the flux loops 14 (e.g., the second flux loop 14) and is configured to propagate an output pulse $INT_{OUT}$ in response to the interrogation pulse $INT_{IN}$ and a first current direction of the input current $I_{IN}$, and to not propagate the output pulse $INT_{OUT}$ in response to the interrogation pulse and a second current direction of the input current $I_{IN}$. For example, in response to the input current $I_{IN}$ having the first current direction, the input current $I_{IN}$ can induce currents in a first direction in each of the flux loops 14 to increase the amplitude of the first current of the first flux loop 14 and decrease the amplitude of the second current of the second flux loop 14. The increase in amplitude of the first current can increase the bias of the Josephson junction associated with the first flux loop 14, such that the Josephson junction can trigger in response to the interrogation pulse $INT_{IN}$. The triggering of the Josephson junction of the first flux loop 14 can thus result in triggering of the Josephson junction of the second flux loop 14, and thus to provide the output pulse $INT_{OUT}$ (e.g., an RQL pulse) from the output stage 16 to indicate that the input current $I_{IN}$ has the first current direction.

In response to the input current $I_{IN}$ having a second direction opposite the first direction, the input current $I_{IN}$ can induce currents in a second direction in each of the flux loops 14 opposite the first direction to decrease the amplitude of the first current of the first flux loop 14 and to increase the amplitude of the second current of the second flux loop 14. The decrease in amplitude of the first current can decrease the bias of the Josephson junction associated with the first flux loop 14. As a result, the Josephson junction of the first flux loop 14 does not trigger in response to the interrogation pulse $INT_{IN}$. Therefore, no pulse is provided from the output stage 16 to indicate that the input current $I_{IN}$ has the second current direction.

Therefore, the flux switch system 10 described herein provides a robust manner of interrogating a current direction of the input current $I_{IN}$ corresponding to a superconducting persistent current, as opposed to typical ADC implementations for interrogating current direction in superconducting circuits. For example, typical ADC designs can exhibit low operating margins and clock-induced noise in the measured circuitry. In order to function, such typical ADCs can be DC-biased to an operating point where the additional current induced in the ADC from the input current to be interrogated (e.g., with the correct polarity) provides a final threshold necessary to excite the Josephson junctions of the ADC, which can lead to a stream of digital "logic ones" at the output. Since the ADC is biased to a point where zero input current produces no data at the output, the scheme of a typical ADC only utilizes half of the input current range available from the superconducting circuitry, which is a major source of the low operating margins. However, the flux switch system 10 is interrogated when the input current $I_{IN}$ is present to provide a first state in the first direction of the input current $I_{IN}$ and a second state in the second direction of the input current $I_{IN}$. In addition, typical ADCs for RQL interrogation rely on Josephson junctions that are biased by the ROL clock lines. The RQL clocked Josephson junctions in the typical ADC can induce noise in the circuitry being measured, which can lead to a distortion of the input signal and can reduce the fidelity of the measurement depending on the sensitivity of the superconducting circuitry being measured. However, the flux switch system 10 implements Josephson junctions that are not biased from the RQL clock signal, as described in greater detail herein, and thus mitigates deleterious effects of noise on the operation of the flux switch system 10.

Figure 2:
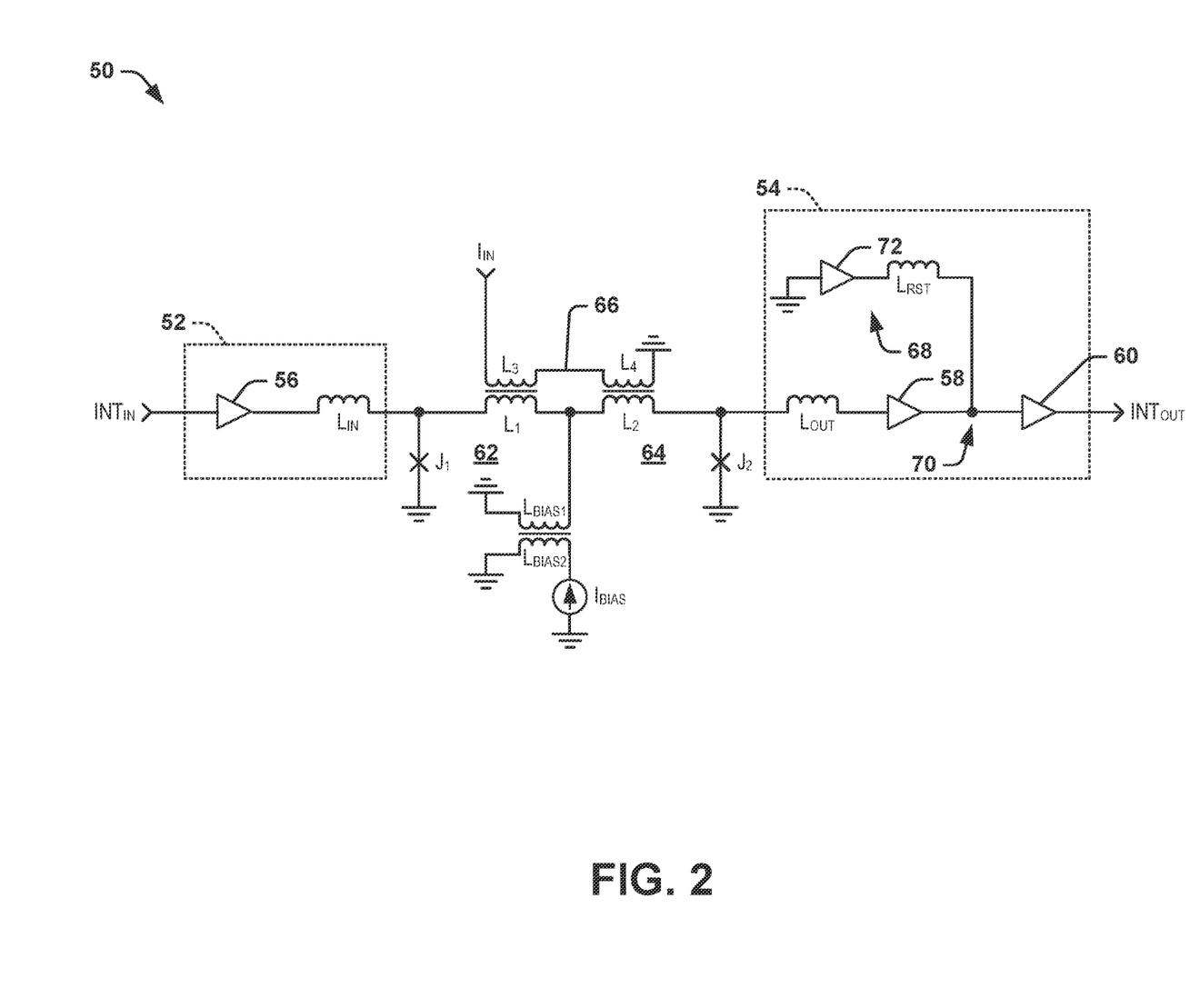
FIG. 2 illustrates an example of a flux switch circuit.

FIG. 2 illustrates an example of a flux switch circuit 50. The flux switch circuit 50 can be implemented in any of a variety of superconducting computer systems to determine a sign (e.g., direction) of an input current $I_{IN}$. The flux switch circuit 50 can correspond to the flux switch system 10 in the example of FIG. 1. Therefore, reference is to be made to the example of FIG. 1 in the following description of the example of FIG. 2.

The flux switch circuit 50 includes an input stage 52 and an output stage 54. In the example of FIG. 2, the input stage 52 includes a JTL 56 and an input inductor $L_{IN}$. The JTL 56 can be configured to receive and propagate an interrogation pulse $INT_{IN}$, such as provided from a previous JTL stage. For example, the interrogation pulse $INT_{IN}$ can be an RQL pulse, such that the JTL 56 can be biased via an RQL clock signal (not shown) to propagate the interrogation pulse $INT_{IN}$ to the input inductor $L_{IN}$. As an example, the interrogation pulse $INT_{IN}$ can be provided to the flux switch circuit 50 to interrogate the state of the input current $I_{IN}$, such that the interrogation pulse $INT_{IN}$ can be provided at a time in which the input current $I_{IN}$ has a non-zero amplitude. Similarly, the output stage 54 includes an output inductor $L_{OUT}$, a first JTL 58, and a second JTL 60. As an example, the first and second JTLs 58 and 60 can likewise be biased via an RQL clock signal (e.g., via the same phase as the JTL 56 for at least the first JTL 58).

The flux switch circuit 50 also includes a first flux loop 62 and a second flux loop 64. The first flux loop 62 is coupled to the input inductor $L_{IN}$ and includes a Josephson junction $J_1$ and an inductor $L_1$. The second flux loop 64 is coupled to an output inductor $L_{OUT}$ and includes a Josephson junction $J_2$ and an inductor $L_2$, such that the inductors $L_1$ and $L_2$ and the Josephson junctions $J_1$ and $J_2$ are configured in a balanced arrangement. As an example, the inductors $L_1$ and $L_2$ can have an approximately equal inductance that is less than an inductance of the inductance of the input inductor $L_{IN}$ and the output inductor $L_{OUT}$. As another example, the input inductor $L_{IN}$ and the output inductor $L_{OUT}$ can have an approximately equal inductance to balance the first and second flux loops 62 and 64, as described in greater detail herein. The flux loops 62 and 64 further include a shared first bias inductor $L_{BIAS1}$ that is inductively coupled to a second bias inductor $L_{BIAS2}$ through which a bias current $I_{BIAS}$ flows. Therefore, the bias current $I_{BIAS}$ is inductively provided to each of the first and second flux loops 62 and 64 in opposite orientations to provide a steady-state bias to each of the Josephson junctions $J_1$ and $J_2$ via approximately equal and opposite current flow through the respective inductors $L_1$ and $L_2$.

Figure 3:
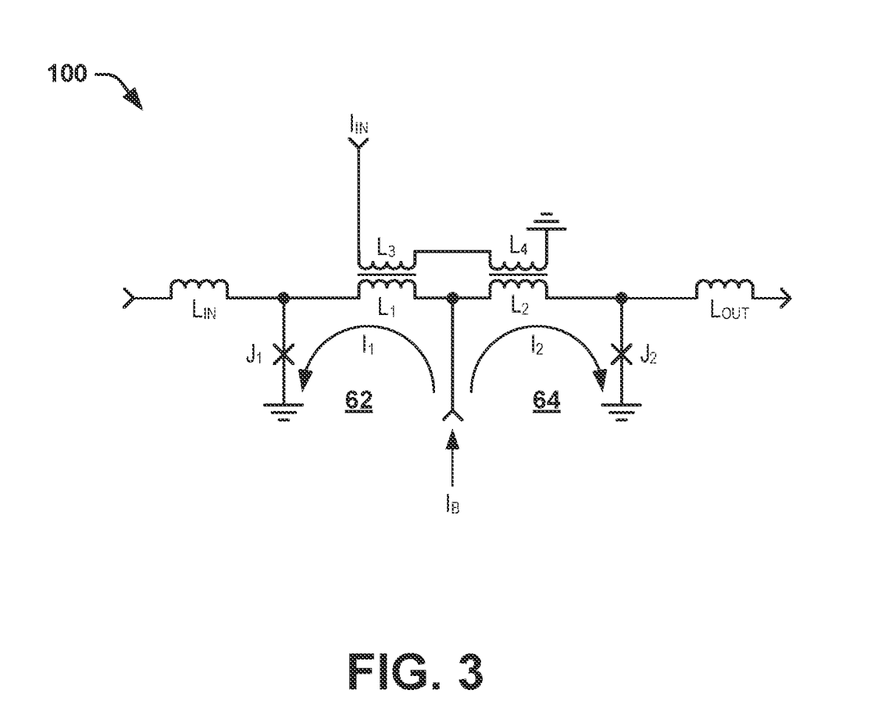
FIG. 3 illustrates another example of a flux switch circuit.

FIG. 3 illustrates another example of a flux switch circuit 100. The flux switch circuit 100 corresponds to a portion of the flux switch circuit 50 in the example of FIG. 2. Therefore, reference is to be made to the example of FIG. 2, and like reference numbers are used as in the example of FIG. 2, in the following description of the example of FIG. 3. The flux switch circuit 100 includes the first flux loop 62 and the second flux loop 64. In the example of FIG. 3, a current $I_B$ that can correspond to the induced current provided by the bias current $I_{BIAS}$ (e.g., via the bias inductors $L_{BIAS1}$ and $L_{BIAS2}$) is provided to each of the flux loops 62 and 64. Therefore, the current $I_B$ is split as a first current $I_1$ that flows in a counter-clockwise orientation through the first inductor $L_1$ and the first Josephson junction $J_1$ about the first flux loop 62 and a second current $I_2$ through the second inductor $L_2$ that flows in a clockwise orientation through the second inductor $L_2$ and the second Josephson junction $J_2$ about the second flux loop 64.

The example of FIG. 3 also demonstrates the input inductor $L_{IN}$ coupled to the first flux loop 62 and the output inductor $L_{OUT}$ coupled to the second flux loop 64. As described previously, the inductors $L_1$ and $L_2$ can have an approximately equal inductance that is less than an inductance of the inductance of the input inductor $L_{IN}$ and the output inductor $L_{OUT}$, and the input inductor $L_{IN}$ and the output inductor $L_{OUT}$ can have an approximately equal inductance to balance the first and second flux loops 62 and 64. Therefore, the current $I_1$ flows through the Josephson junction $J_1$ (as opposed to the input inductor $L_{IN}$ having a high impedance) and the current $I_2$ flows through the Josephson junction $J_2$ (as opposed to the output inductor $L_{OUT}$ having a high impedance). Therefore, the currents $I_1$ and $I_2$ can be approximately equal in amplitude at steady-state corresponding to an absence of the input current $I_{IN}$, as described in greater detail herein, to provide a steady-state bias of the Josephson junctions $J_1$ and $J_2$, respectively.

Referring back to the example of FIG. 2, the inductor $L_1$ is inductive coupled to an inductor $L_3$ and the inductor $L_2$ is inductively coupled to an inductor $L_4$. The inductors $L_3$ and $L_4$ are arranged in series on a conductor 66 through which the input current $I_{IN}$ is provided in either a first direction or a second direction opposite the first direction. Therefore, when the input current $I_{IN}$ is provided on the conductor 66, the input current $I_{IN}$ induces a current in the flux loops 62 and 64 that results in a net amplitude change of the currents $I_1$ and $I_2$. Because the currents $I_1$ and $I_2$ flow in opposite directions through the inductors $L_1$ and $L_2$, the input current $I_{IN}$ thus changes the amplitude of the currents $I_1$ and $I_2$ relative to each other by increasing the amplitude of one of the currents $I_1$ and $I_2$ and equally decreasing the amplitude of the other one of the currents $I_1$ and $I_2$ based on the direction of the input current $I_{IN}$. As a result, the bias of the Josephson junctions $J_1$ and $J_2$ can change relative to each other based on the current direction, and thus sign, of the input current $I_{IN}$.

Figure 4:
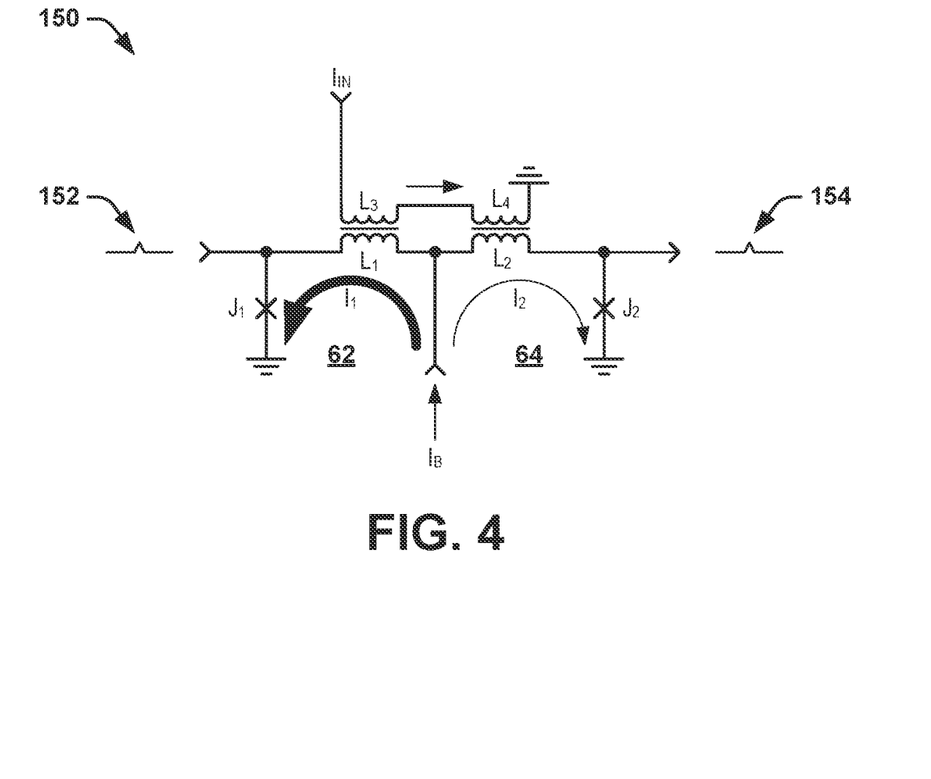
FIG. 4 illustrates another example of a flux switch circuit.

FIG. 4 illustrates another example of a flux switch circuit 150. The flux switch circuit 150 corresponds to a portion of the flux switch circuit 50 in the example of FIG. 2. Therefore, reference is to be made to the examples of FIGS. 2 and 3, and like reference numbers are used as in the example of FIG. 2, in the following description of the example of FIG. 4. The flux switch circuit 150 includes the first flux loop 62 and the second flux loop 64. In the example of FIG. 4, a current $I_B$ that can correspond to the induced current provided by the bias current $I_{BIAS}$ (e.g., via the bias inductors $L_{BIAS1}$ and $L_{BIAS2}$) is provided to each of the flux loops 62 and 64. Therefore, the current $I_B$ is split as the first current $I_1$ that flows in a counter-clockwise orientation through the first inductor $L_1$ and the first Josephson junction $J_1$ about the first flux loop 62 and the second current $I_2$ through the second inductor $L_2$ that flows in a clockwise orientation through the second inductor $L_2$ and the second Josephson junction $J_2$ about the second flux loop 64.

In the example of FIG. 4, the input current $I_{IN}$ is demonstrated as being provided on the conductor 66 in a first direction (e.g., first sign). As a result of the input current $I_{IN}$ being provided on the conductor 66, and thus through the inductors $L_3$ and $L_4$, the inductor $L_3$ induces a current via the inductor $L_1$ on the first flux loop 62 that is additive to the first current $I_1$. Therefore, the first current $I_1$ is demonstrated in the example of FIG. 4 as a thicker line to correspond to an increase in amplitude of the first current $I_1$ as a result of the additive amplitude (e.g., same direction as the current $I_B$) provided from the induced coupling to the input current $I_{IN}$ in the first direction. Similarly, the inductor $L_4$ induces a current via the inductor $L_2$ on the second flux loop 64 that is subtractive from the second current $I_2$. Therefore, the second current $I_2$ is demonstrated in the example of FIG. 4 as a thinner line to correspond to a decrease in amplitude of the second current $I_2$ as a result of the subtractive amplitude (e.g., opposite direction as the current $I_B$) provided from the induced coupling to the input current $I_{IN}$ in the first direction.

Based on the increase in amplitude of the first current $I_1$, the first current $I_1$ increases the bias of the first Josephson junction $J_1$. As described previously, the interrogation pulse $INT_{IN}$, demonstrated in the example of FIG. 4 at 152, can be provided to, and propagate through, the input stage 52 to interrogate the sign of the input current $I_{IN}$. In response to the interrogation pulse $INT_{IN}$ being provided from the input stage 52 through the input inductor $L_{IN}$ (not shown in the example of FIG. 4), the interrogation pulse $INT_{IN}$ can add to the increased bias of the Josephson junction $J_1$ to trigger the Josephson junction $J_1$. Therefore, the Josephson junction $J_1$ can likewise generate a voltage pulse that propagates through the inductor $L_1$ and through the inductor $L_2$ to also trigger the Josephson junction $J_2$. Accordingly, the Josephson junction $J_2$ can emit a voltage pulse corresponding to the output pulse $INT_{OUT}$, demonstrated in the example of FIG. 4 at 154, that can propagate to and through the output stage 54 to indicate that the input current $I_{IN}$ has the first sign, and thus flows in the first direction.

Figure 5:
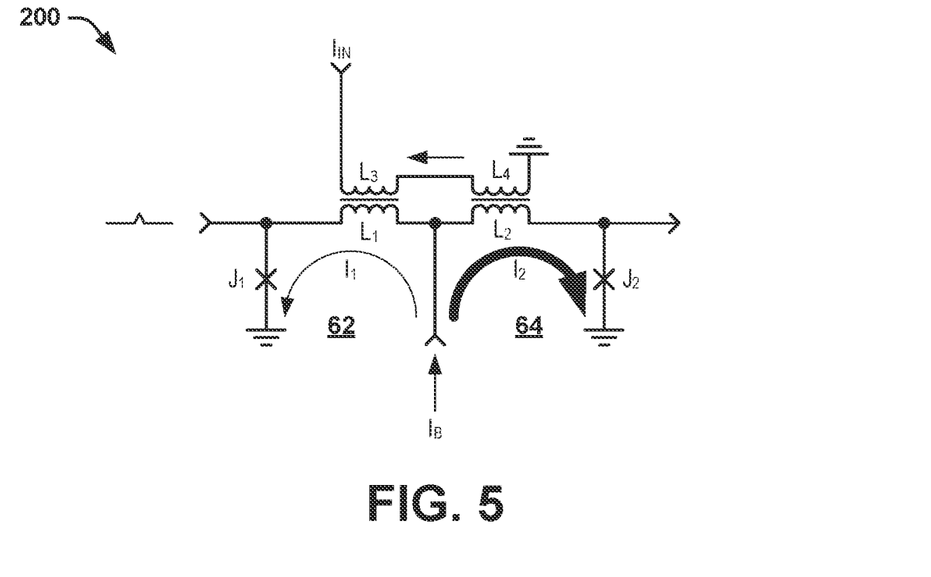
FIG. 5 illustrates another example of a flux switch circuit.

FIG. 5 illustrates another example of a flux switch circuit 200. The flux switch circuit 200 corresponds to a portion of the flux switch circuit 50 in the example of FIG. 2. Therefore, reference is to be made to the examples of FIGS. 2 through 4, and like reference numbers are used as in the example of FIG. 2, in the following description of the example of FIG. 5. The flux switch circuit 200 includes the first flux loop 62 and the second flux loop 64. In the example of FIG. 5, a current $I_B$ that can correspond to the induced current provided by the bias current $I_{BIAS}$ (e.g., via the bias inductors $L_{BIAS1}$ and $L_{BIAS2}$) is provided to each of the flux loops 62 and 64. Therefore, the current $I_B$ is split as the first current $I_1$ that flows in a counter-clockwise orientation through the first inductor $L_1$ and the first Josephson junction $J_1$ about the first flux loop 62 and the second current $I_2$ through the second inductor $L_2$ that flows in a clockwise orientation through the second inductor $L_2$ and the second Josephson junction $J_2$ about the second flux loop 64.

In the example of FIG. 5, the input current $I_{IN}$ is demonstrated as being provided on the conductor 66 in a second direction (e.g., second sign) opposite the first direction of the example of FIG. 4. As a result of the input current $I_{IN}$ being provided on the conductor 66, and thus through the inductors $L_3$ and $L_4$, the inductor $L_3$ induces a current via the inductor $L_1$ on the first flux loop 62 that is subtractive from the first current $I_1$. Therefore, the first current $I_1$ is demonstrated in the example of FIG. 5 as a thinner line to correspond to a decrease in amplitude of the first current $I_1$ as a result of the subtractive amplitude (e.g., opposite direction as the current $I_B$) provided from the induced coupling to the input current $I_{IN}$ in the second direction. Similarly, the inductor $L_4$ induces a current via the inductor $L_2$ on the second flux loop 64 that is additive to the second current $I_2$. Therefore, the second current $I_2$ is demonstrated in the example of FIG. 5 as a thicker line to correspond to an increase in amplitude of the second current $I_2$ as a result of the additive amplitude (e.g., same direction as the current $I_B$) provided from the induced coupling to the input current $I_{IN}$ in the second direction.

Based on the decrease in amplitude of the first current $I_1$, the first current $I_1$ decreases the bias of the first Josephson junction $J_1$. As described previously, the interrogation pulse $INT_{IN}$, demonstrated in the example of FIG. 5 at 202, can be provided to, and propagate through, the input stage 52 to interrogate the sign of the input current $I_{IN}$. In response to the interrogation pulse $INT_{IN}$ being provided from the input stage 52 through the input inductor $L_{IN}$ (not shown in the example of FIG. 5), and based on the decrease in bias of the Josephson junction $J_1$, the interrogation pulse $INT_{IN}$ can be insufficient to trigger the Josephson junction $J_1$. Therefore, no voltage pulses propagate through the flux switch circuit 50 to and through the output stage 54, and thus the output stage 54 does not provide the output pulse $INT_{OUT}$ to indicate that the input current $I_{IN}$ has the second sign, and thus flows in the second direction.

Referring back to the example of FIG. 2, as described previously, the interrogation pulse $INT_{IN}$ can be provided as an RQL pulse that includes a positive fluxon followed in time by a negative fluxon (e.g., as a reciprocal pair). Therefore, the flux switch circuit 50 can be implemented in an RQL circuit. For example, based on the high inductance value of the input inductor $L_{IN}$, the negative fluxon of the RQL pulse can be rejected (e.g., reflected), such that only the positive fluxon passes through the input inductor $L_{IN}$ to the first Josephson junction $J_1$. In addition, the output stage 54 includes a reset stage 68 coupled to a node 70 that interconnects the first and second JTLs 58 and 60. The reset stage 68 is configured to provide a negative fluxon in response to the output pulse $INT_{OUT}$ to reset the Josephson junctions $J_1$ and $J_2$ (e.g., as well as the Josephson junction(s) of the first JTL 58).

The reset stage 68 includes a JTL 72 that interconnects a low-voltage rail (e.g., ground) at an input and the node 70 (via an inductor $L_{RST}$) at an output. As described previously, the triggering of the Josephson junction $J_1$ (e.g., in response to the input current $I_{IN}$ being provided in the first direction as demonstrated in the example of FIG. 4) results in a triggering of the Josephson junction $J_2$ to propagate a voltage pulse to the output stage 54. The first JTL 58 can thus likewise propagate a voltage pulse that is provided to both the JTL 72 of the reset stage 68 and to the second JTL 60. The second JTL 60 can thus propagate the voltage pulse as the positive fluxon of the RQL output pulse $INT_{OUT}$. However, because the JTL 72 of the reset stage 68 is arranged opposite with respect to the input and output relative to the JTLs 58 and 60, the voltage pulse provided to the JTL 72 is provided to the low-voltage rail, and is thus reflected as a negative fluxon. The negative fluxon therefore propagates back through the JTL 58 and to the Josephson junctions $J_1$ and $J_2$, thus resetting the Josephson junctions $J_1$ and $J_2$, as well as the Josephson junction(s) associated with the JTL 58. The negative fluxon also propagates through the second JTL 60 and is output as the negative fluxon of the reciprocal pair of the RQL output pulse $INT_{OUT}$.

Figure 6:
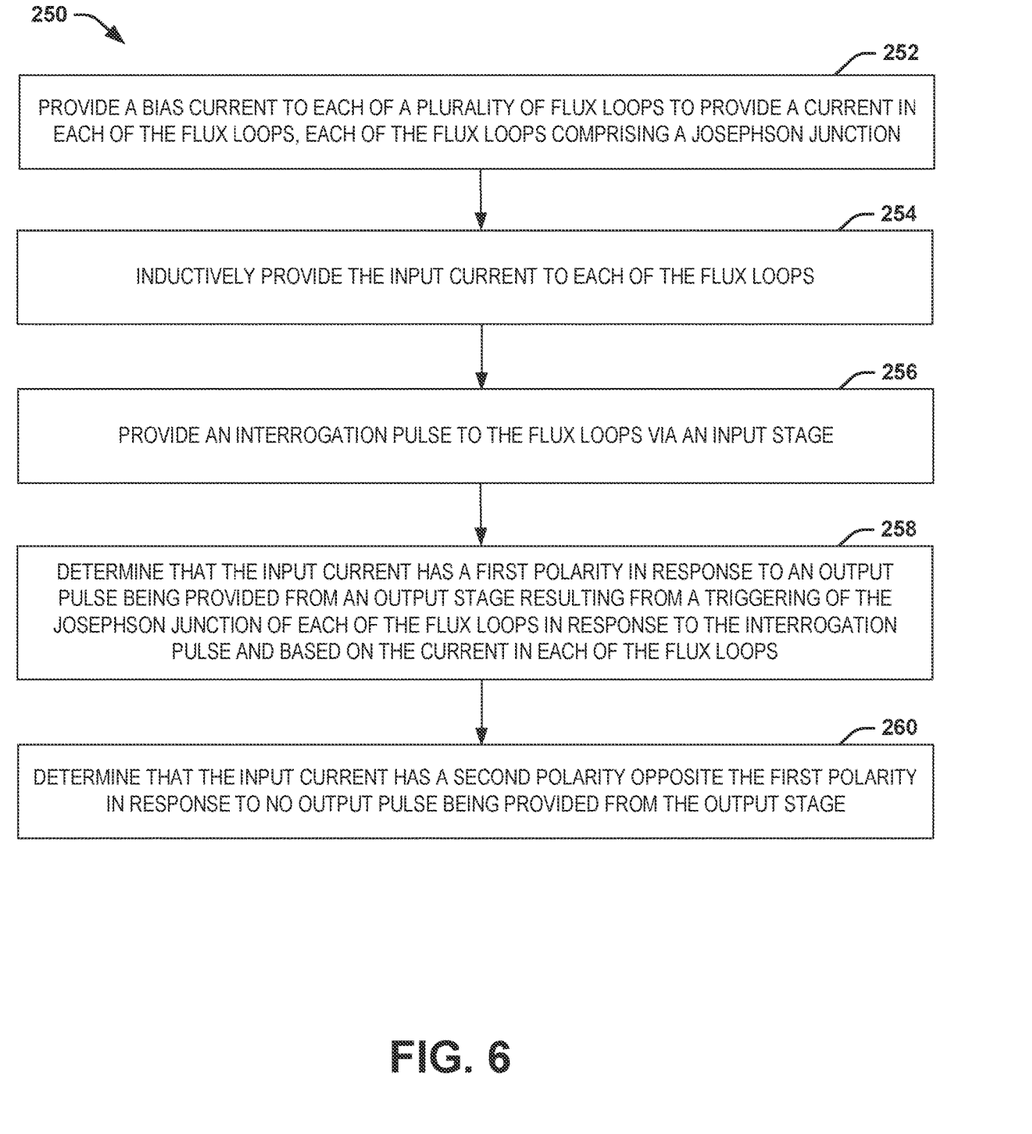
FIG. 6 illustrates an example of a method for determining a polarity of an input current.

In view of the foregoing structural and functional features described above, a methodology in accordance with various aspects of the disclosure will be better appreciated with reference to FIG. 6. FIG. 6 illustrates an example of a method 250 for determining a polarity of an input current. It is to be understood and appreciated that the method for FIG. 6 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

At 252, a bias current (e.g., the bias current bras) is provided to each of a plurality of flux loops (e.g., the flux loops 60 and 62) to provide a current (e.g., the currents $I_1$ and $I_2$) in each of the flux loops, each of the flux loops comprising a Josephson junction (e.g., the Josephson junctions $J_1$ and $J_2$). At 254, the input current (e.g., the input current $I_{IN}$) is inductively provided to each of the flux loops. At 256, an interrogation pulse (e.g., the interrogation pulse $INT_{IN}$) is provided to the flux loops via an input stage (e.g., the input stage 52). At 258, it is determined that the input current has a first polarity in response to an output pulse (e.g., the output pulse $INT_{OUT}$) being provided from an output stage (e.g., the output stage 54) resulting from a triggering of the Josephson junction of each of the flux loops in response to the interrogation pulse and based on the current in each of the flux loops. At 260, it is determined that the input current has a second polarity opposite the first polarity in response to no output pulse being provided from the output stage.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. A flux switch system comprising:
   an input stage configured to provide an interrogation pulse;
   a plurality of flux loops configured to receive an input current, each of the flux loops comprising a Josephson junction configured to trigger to generate an output pulse in response to a first polarity of the input current and to not trigger to generate no output pulse in response to a second polarity of the input current opposite the first polarity; and
   an output stage configured to propagate the output pulse to an output of the flux switch system.

2. The system of claim 1, wherein the plurality of flux loops comprises:
   a first flux loop comprising a first inductor that is inductively coupled to the input current and a first Josephson junction, each of the first inductor and the first Josephson junction being coupled to the input stage; and
   a second flux loop comprising a second inductor that is inductively coupled to the input current and a second Josephson junction, each of the second inductor and the second Josephson junction being coupled to the output stage, wherein each of the first and second flux loops are configured to circulate a first current and a second current, respectively, having amplitudes that are based on the polarity of the input current.

3. The system of claim 2, wherein a bias current is provided to each of the first and second flux loops to provide a steady-state equal and opposite amplitude with respect to a flux associated with the first and second currents.

4. The system of claim 2, wherein the first inductor is configured to increase the amplitude of the first current in response to the first polarity of the input current and to decrease the amplitude of the first current in response to the second polarity of the input current, wherein the second inductor is configured to decrease the amplitude of the second current in response to the first polarity of the input current and to increase the amplitude of the second current in response to the second polarity of the input current.

5. The system of claim 2, wherein the input stage comprises an input inductor, wherein the first and second inductors have an inductance value that is less than the inductance value of the input inductor.

6. The system of claim 1, wherein the input stage comprises an input Josephson transmission line (JTL) and the output stage comprises an output JTL.

7. The system of claim 6, wherein the interrogation pulse is provided as a reciprocal quantum logic (RQL) pulse, wherein each of the input JTL and the output JTL are configured to receive an AC RQL clock signal.

8. The system of claim 6, wherein the output stage further comprises a reset stage configured to provide a negative fluxon in response to the output pulse to reset each Josephson junction of the respective plurality of flux loops.

9. The system of claim 8, wherein the reset stage is arranged as a JTL comprising an input that is coupled to a low-voltage rail and an output that is coupled to the output JTL, wherein the reset stage is configured to receive the output pulse and to reflect the output pulse as the negative fluxon.

10. A method for determining a polarity of an input current, the method comprising:
    providing a bias current to each of a plurality of flux loops to provide a current in each of the flux loops, each of the flux loops comprising a Josephson junction;
    inductively providing the input current to each of the flux loops;
    providing an interrogation pulse to the flux loops via an input stage;
    determining that the input current has a first polarity in response to an output pulse being provided from an output stage resulting from a triggering of the Josephson junction of each of the flux loops in response to the interrogation pulse and based on the current in each of the flux loops; and
    determining that the input current has a second polarity opposite the first polarity in response to no output pulse being provided from the output stage.

11. The method for claim 10, wherein the plurality of flux loops comprises:
    a first flux loop comprising a first inductor that is inductively coupled to the input current and a first Josephson junction, each of the first inductor and the first Josephson junction being coupled to the input stage; and
    a second flux loop comprising a second inductor that is inductively coupled to the input current and a second Josephson junction, each of the second inductor and the second Josephson junction being coupled to the output stage, wherein each of the first and second flux loops are configured to circulate respective first and second currents, respectively, having amplitudes that are based on the polarity of the input current.

12. The method for claim 11, wherein providing the input current comprises:
    increasing the amplitude of the first current and decreasing the amplitude of the second current in response to the first polarity of the input current to facilitate triggering of the first and second Josephson junctions in response to the interrogation pulse; and
    decreasing the amplitude of the first current and increasing the amplitude of the second current in response to the second polarity of the input current to facilitate not triggering the first and second Josephson junctions in response to the interrogation pulse.

13. The method for claim 10, wherein the input stage comprises an input inductor, wherein the first and second inductors have an inductance value that is less than the inductance value of the input inductor.

14. The method for claim 10, wherein the providing the interrogation pulse comprises providing the interrogation pulse as a reciprocal quantum logic (RQL) pulse via an input Josephson transmission line (JTL) associated with the input stage, the method further comprising providing an RQL clock signal to the input JTL and to an output JTL associated with the output stage.

15. The method for claim 10, further comprising resetting the Josephson junction associated with each of the flux loops in response to the output pulse.

16. The method for claim 15, wherein resetting the Josephson junction comprises reflecting the output pulse from a reset stage associated with the output stage as a negative fluxon to reset each Josephson junction of the respective flux loops.

17. A flux switch system comprising:
- an input stage configured to provide a reciprocal quantum logic (RQL) interrogation pulse;
- a first flux loop comprising a first inductor that is inductively coupled to an input current and a first Josephson junction, each of the first inductor and the first Josephson junction being coupled to the input stage, the first flux loop being configured to conduct a first current in response to a bias current;
- a second flux loop comprising a second inductor that is inductively coupled to the input current and a second Josephson junction, the second flux loop being configured to conduct a second current in response to the bias current, the first and second Josephson junctions being configured to trigger to generate an RQL output pulse in response to a first polarity of the input current and the RQL interrogation pulse based on a relative of the first and second currents, and are configured to not trigger in response to a second polarity of the input current and the RQL interrogation pulse;
- an output stage coupled to the second inductor and the second Josephson junction, the output stage being configured to propagate the RQL output pulse to an output of the flux switch system.

18. The system of claim 17, wherein the bias current is provided to each of the first and second flux loops to provide a steady-state equal and opposite amplitude with respect to a flux associated with the first and second currents, such that the first inductor is configured to increase the amplitude of the first current in response to the first polarity of the input current and to decrease the amplitude of the first current in response to the second polarity of the input current, wherein the second inductor is configured to decrease the amplitude of the second current in response to the first polarity of the input current and to increase the amplitude of the second current in response to the second polarity of the input current.

19. The system of claim 17, wherein the input stage comprises an input inductor, wherein the first and second inductors have an inductance value that is less than the inductance value of the input inductor.

20. The system of claim 17, wherein the output stage further comprises a reset stage configured to provide a negative fluxon in response to the RQL output pulse to reset each of the first and second Josephson junction of the respective first and second flux loops.

\* \* \* \* \*